US009255581B2

United States Patent
Chen

(10) Patent No.: US 9,255,581 B2
(45) Date of Patent: Feb. 9, 2016

(54) FAN CONTROL SYSTEM AND FAN CONTROL METHOD

(71) Applicants: Inventec (Pudong) Technology Corporation, Shanghai (CN); INVENTEC CORPORATION, Taipei (TW)

(72) Inventor: Chia-Hsiang Chen, Taipei (TW)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 453 days.

(21) Appl. No.: 13/789,245

(22) Filed: Mar. 7, 2013

(65) Prior Publication Data

US 2014/0119882 A1    May 1, 2014

(30) Foreign Application Priority Data

Oct. 30, 2012   (CN) .......................... 2012 1 0425000

(51) Int. Cl.
*F04D 27/00* (2006.01)
*G06F 1/20* (2006.01)
*H05K 7/20* (2006.01)

(52) U.S. Cl.
CPC ............... *F04D 27/004* (2013.01); *G06F 1/20* (2013.01); *H05K 7/20209* (2013.01)

(58) Field of Classification Search
CPC ............ H02J 9/061; H02J 1/102; H02J 1/10; G06F 1/26; G06F 1/263; G06F 1/20; F04D 27/004; H05K 7/20209; F16D 43/25; F16D 9/02; F16D 48/064; F01P 7/087; B60W 2510/0291; F24F 11/0012; F24F 11/053; F24F 11/0001; F24F 11/0009; F24F 11/006
USPC .......................... 307/85; 236/49.3; 192/82 T
See application file for complete search history.

(56) References Cited

U.S. PATENT DOCUMENTS

| | | | |
|---|---|---|---|
| 2008/0072089 A1* | 3/2008 | Chang et al. ................... | 713/330 |
| 2009/0116823 A1* | 5/2009 | Zhang et al. ................... | 388/811 |
| 2011/0273833 A1* | 11/2011 | Zhang et al. ............. | 361/679.32 |
| 2012/0134085 A1* | 5/2012 | Gau et al. ................. | 361/679.02 |
| 2012/0136489 A1* | 5/2012 | Wang et al. ................... | 700/282 |
| 2012/0136502 A1* | 5/2012 | Liu .............................. | 700/300 |
| 2013/0135819 A1* | 5/2013 | Wang ....................... | 361/679.48 |
| 2013/0135821 A1* | 5/2013 | Hsien ....................... | 361/679.48 |
| 2013/0138804 A1* | 5/2013 | Hsien ........................... | 709/224 |
| 2013/0138979 A1* | 5/2013 | Wang ........................... | 713/300 |

* cited by examiner

*Primary Examiner* — Thienvu Tran
*Assistant Examiner* — Brian K Baxter
(74) *Attorney, Agent, or Firm* — Locke Lord LLP; Tim Tingkang Xia, Esq.

(57) ABSTRACT

A fan control system and a method thereof are applicable to a computer device. The system includes a fan, a board management unit, a power control module and a rotation speed switching module. The fan is driven by a control power and a rotation speed control signal. The board management unit provides a fan enabling signal, a rotation speed switching signal and a first fan rotation speed signal in a standby state. The power control module receives the fan enabling signal to determine whether to provide the control power to the fan, and switches between an auxiliary power or a main power served as the control power to the fan. The rotation speed switching module receives the rotation speed switching signal to accordingly switch between the first fan rotation speed signal or a second fan rotation speed signal served as the rotation speed control signal to the fan.

4 Claims, 4 Drawing Sheets

FAN CONTROL SYSTEM AND FAN CONTROL METHOD

CROSS-REFERENCE TO RELATED APPLICATIONS

This non-provisional application claims priority under 35 U.S.C. §119(a) on Patent Application No(s). 201210425000.7 filed in China on Oct. 30, 2012, the entire contents of which are hereby incorporated by reference.

BACKGROUND OF THE DISCLOSURE

1. Technical Field of the Disclosure

The disclosure relates to fan control technologies of a computer device, and more particularly to a fan control system and a fan control method capable of automatically switching a fan rotation speed and adjusting the power energy when the computer device is in a standby state.

2. Description of the Related Art

When a computer device operates in a standby state (that is, in an S5 state or a soft off state defined in an Advanced Configuration and Power Interface (ACPI)), although the user thinks that the computer device is already shut down, the computer device actually does not stop operation completely. That is, a part of the apparatuses in the computer device still remain running in the standby state. The heat generated by these apparatuses still needs to be dissipated, so that a part of the fans still need to run in the standby state.

Conventionally, fans driven by an auxiliary (AUX) power are mounted on the apparatuses that still need to run in the standby state, and a board management controller (BMC) is used for controlling these fans. Since these fans are driven by the AUX power, if the fan rotation speed, set by the BMC, is too high, the power energy quantity of the AUX power is momentarily insufficient and causes the power supply unit to reset, and accordingly, the computer device is unstable. Therefore, a fault may occur when the BMC automatically sets the fan rotation speed in the standby state, and the above situation may be resulted.

Besides, since the fan is merely driven by a single power (the AUX power), when the computer device returns from the standby state to a runtime state, the heat dissipation effect of the fan is greatly lowered, which does not meet the heat dissipation requirement of the current computer device in the runtime state.

SUMMARY OF THE DISCLOSURE

An embodiment of the disclosure provides a fan control system applicable to a computer device. The fan control system comprises a fan, a board management unit, a power control module and a rotation speed switching module. The fan is driven by a control power and a rotation speed control signal. The board management unit is configured to provide a fan enabling signal, a rotation speed switching signal and a first fan rotation speed signal in a standby state of the computer device. The power control module, coupled to the board management unit and the fan, is configured to receive the fan enabling signal so as to determine whether to provide the control power to the fan, and is configured to switch between an AUX power or a main power that serves as the control power according to a power supply condition of the computer device, so as to provide the control power to the fan. The rotation speed switching module, coupled to the board management unit and the fan, is configured to receive the rotation speed switching signal so as to accordingly switch between the first fan rotation speed signal or a second fan rotation speed signal that serves as the rotation speed control signal, and is configured to provide the rotation speed control signal to the fan.

Another embodiment of the disclosure provides a fan control method, applicable to a computer device comprising a fan. The fan control method comprises the following steps. A fan enabling signal, a rotation speed switching signal and a first fan rotation speed signal is provided in a standby state of the computer device. Whether to provide a control power to the fan according to the fan enabling signal is determined. When it is determined to provide the control power to the fan, an AUX power or a main power that serves as the control power is switched between according to a power supply condition of the computer device. The first fan rotation speed signal or a second fan rotation speed signal that serves as a rotation speed control signal is switched between according to the rotation speed switching signal. The fan is driven by the control power and the rotation speed control signal.

BRIEF DESCRIPTION OF THE DRAWINGS

The disclosure will become more fully understood from the detailed description given herein below for illustration only, thus does not limit the disclosure, wherein.

DETAILED DESCRIPTION

Figure 1:
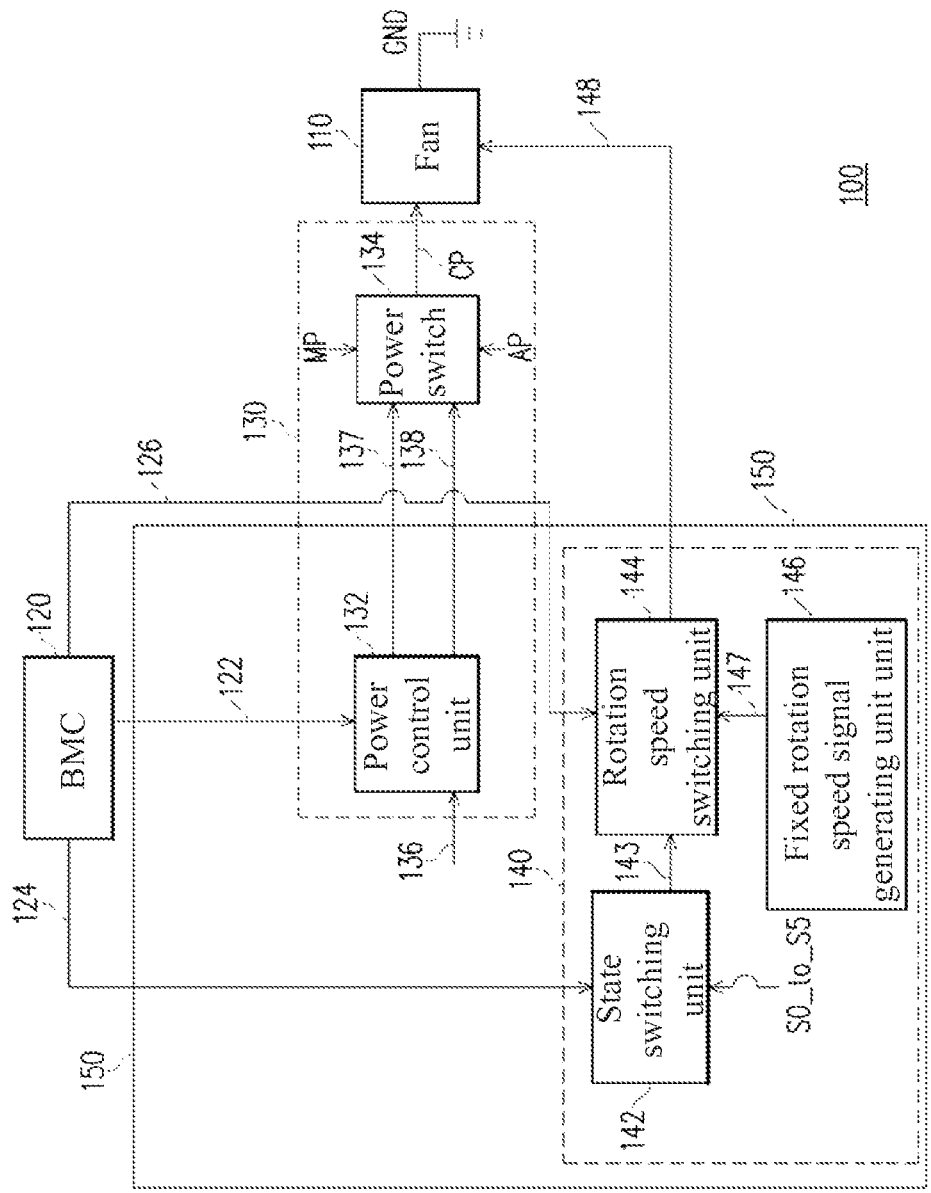
FIG. 1 is a block diagram of a fan control system according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a block diagram of a fan control system 100 adapted to a computer device comprising a fan 110 according to a first embodiment of the disclosure. Please refer to FIG. 1, the fan control system 100 comprises a fan 110, a board management unit, a power control module 130 and a rotation speed switching module 140. In this embodiment, a BMC 120 is used as the board management unit. In some other embodiments, a chip set, a south-bridge chip or a relevant physical circuit used for controlling a fan in the computer device is also suitable for being used as the board management unit, and the embodiment of the disclosure is not limited thereto.

The fan 110 in this embodiment is mounted on a part of the apparatuses that need to operate in a standby state of the computer device, such as the BMC 120, a network module, and a complex programmable logic device (CPLD) 150 supported by an AUX power AP to operate. Thereby, in this embodiment, the amount of the fans 110 is not limited to one, and a plurality of fans is adopted in some other embodiments. A grounding terminal of the fan 110 is coupled to a grounding voltage GND, and a power terminal of the fan is coupled to an output terminal of a power switch 134 in the power control module 130, so as to receive a control power CP. The rotation speed of the fan 110 is controlled and adjusted by a rotation speed control signal 148 provided by the rotation speed switching module 140. Therefore, the fan is driven by the control power CP and the rotation speed control signal 148. In this embodiment, the rotation speed control signal 148 is, for example, a pulse width modulation (PWM) signal, and the rotation speed of a motor in the fan 110 is controlled by the PWM signal.

In this and some other embodiments, the BMC 120 determines a power management state of the computer device (for example, whether the computer device is in a runtime state (S0 state, namely, normal operation) or a standby state (S5 state)) in various manners. In this embodiment, the BMC 120 acquires the power management state of the computer device through other apparatuses such as a power sequence unit. During the standby state of the computer device, the BMC 120 provides a fan enabling signal 122 and a rotation speed switching signal 124, and when the fan 110 is automatically controlled, the BMC 120 also provides a first fan rotation speed signal 126 to adjust the fan rotation speed.

The power control module 130 is coupled to the BMC 120 and the fan 110. The power control module 130 receives the fan enabling signal 122 to determine whether to provide the control power CP and to determine the specific control power CP to be provided to the fan 110. In this embodiment, the power control module 130 comprises a power control unit 132 and a power switch 134. In this and some other embodiments, the power control unit 132 is implemented by the CPLD 150, and the power switch 134 is implemented by an analog switch having a large voltage bearing capacity. The power control unit 132 receives the fan enabling signal 122 and determines whether the fan enabling signal 122 is an enabling signal, so as to determine whether the fan 110 is rotated or driven in the standby state of the computer device. In other words, when the fan enabling signal 122 is the enabling signal, the BMC 120 controls the fan 110 to be driven in the standby state of the computer device. Therefore, the power control unit 132 receives a power supply signal 136 provided by a power supply unit in the computer device, so as to determine a power supply condition of the computer device and provide a main power enabling signal 137 and an AUX power enabling signal 138 according to the power supply condition. The power switch 134 receives the main power MP and the AUX power AP as well as providing the control power CP according to the main power enabling signal 137 and the AUX power enabling signal 138.

For example, when the main power enabling signal 137 is an enabling signal, the power supply unit provides the main power MP. Therefore, when the main power enabling signal 137 is the enabling signal, the power switch 134 conducts the main power MP to the output terminal of the power switch 134 to serve as the control power CP. When the main power enabling signal 137 is a disabling signal and the AUX power enabling signal 138 is an enabling signal, the power supply unit does not provide the main power MP but merely provides the AUX power AP, so that the power switch 134 conducts the AUX power AP to the output terminal of the power switch to serve as the control power CP. Therefore, in this embodiment of the disclosure, the control power of the fan 110 is dynamically adjusted according to the power supply condition of the computer device. Generally, in this and some other embodiments, in the standby state of the computer device, since the main power MP is not provided, the power switch 134 merely uses the AUX power AP to serve as the control power CP, and in the runtime state, the power switch 134 uses the main power MP to serve as the control power CP.

In this embodiment, in the standby state of the computer device, two rotation speed control methods are selected in the embodiment of the disclosure according to the rotation speed switching signal 124 provided by the BMC 120. In the first rotation speed control method, the first fan rotation speed signal 126 of the BMC 120 is used for automatically controlling the rotation speed of the fan 110. In the second rotation speed control method, a second fan rotation speed signal 147, (that is, a PWM signal whose clock frequency is fixed) provided by the rotation speed switching module 140 in the standby state, is used for controlling the rotation speed of the fan 110. Therefore, when the BMC 120 usually sends an excessively high fan rotation speed signal to cause a resetting of the power supply unit, an internal circuit design or the user generally makes the fan 110 driven to run at a fixed rotation speed through the adjustment of the rotation speed switching signal 124, so that the fan 110 is capable of dissipating some of the heat.

In this embodiment, the rotation speed switching module 140 comprises a state switching unit 142, a fixed rotation speed signal generating unit 146 and a rotation speed switching unit 144. In this embodiment, the state switching unit 142, the fixed rotation speed signal generating unit 146 and the rotation speed switching unit 144 are all implemented by the CPLD 150, but other similar devices (for example, a logic circuit and a field programmable gate array (FPLA)) are also applicable in this disclosure, and the implementation manner is not limited thereto. The state switching unit 142 receives the rotation speed switching signal 124 and a runtime-to-standby signal S0_to_S5. When the runtime-to-standby signal S0_to_S5 is an enabling signal, the computer device enters the standby state from the runtime state. Therefore, the state switching unit 142 provides the rotation speed adjusting signal 143 according to the rotation speed switching signal 124. The fixed rotation speed signal generating unit 146 generates a PWM signal whose clock frequency is fixed to serve as the second fan rotation speed signal 147 according to a predetermined parameter provided in the circuit design. In this embodiment, the fixed rotation speed signal generating unit 146 is, for example, a clock oscillator whose clock frequency is fixed, but the embodiment of the disclosure is not limited thereto. The rotation speed switching unit 144, coupled to the state switching unit 142 and the fixed rotation speed signal generating unit 146, is configured to receive the rotation speed adjusting signal 143 and to accordingly determine whether to switch between the first fan rotation speed signal 126 (for example, when the rotation speed adjusting signal 143 or the state switching unit 142 is an enabling signal) or the second fan rotation speed signal 147 (for example, when the rotation speed adjusting signal 143 or the state switching unit 142 is a disabling signal) that serves as the rotation speed control signal 148.

In view of the above, the fan control system 100 is capable of automatically adjusting the power supply of the fan 110 and controlling the rotation speed thereof according to the power management state (for example, the runtime state or the standby state) and the power supply condition of the computer device, so that the heat dissipation effect of some of the apparatuses in the standby state may be maintained at a certain level, and the heat generated by these apparatuses may be dissipated sufficiently by using the same fan 110 in the runtime state.

In the implementation of the first embodiment, when the fan in the standby state is controlled by the BMC 120, a fault may occur occasionally and lead to a resetting of the computer device or failure of the BMC 120. Therefore, to enable the fan 110 to dissipate heat when the BMC 120 fails, a monitoring device is additionally provided in a second embodiment that follows the spirit of the disclosure to serve as an auxiliary protection mechanism for driving the fan, so that when the fan is not started for a long time in the standby state, some of the apparatuses (for example, the CPLD) that may still run and rarely fail are used to forcedly start the fan and enable the fan to run, so as to automatically maintain the heat dissipation efficiency of the computer device.

Figure 2:
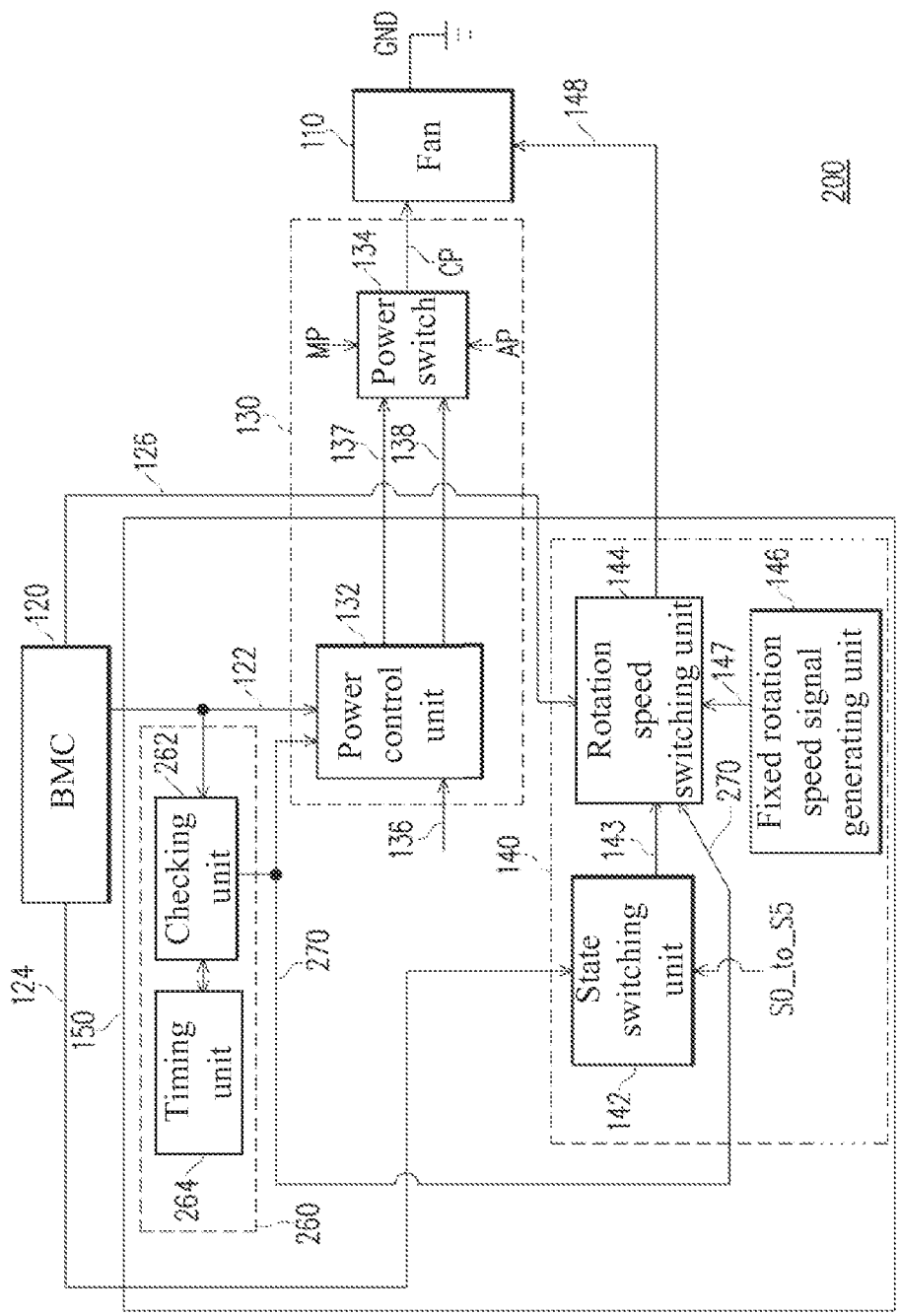
FIG. 2 is a block diagram of a fan control system according to a second embodiment of the disclosure.

FIG. 2 is a block diagram of a fan control system 200 adapted to a computer device comprising the fan 110 according to the second embodiment of the disclosure. Please refer to FIG. 3, a part of the components in this embodiment are similar to those in the first embodiment, and therefore, reference can be made to the foregoing embodiment for this part of the descriptions, which are not repeated herein. Compared with the first embodiment, a monitoring module 260, coupled to the BMC 120, the power control module 130 and the rotation speed switching module 144, is added in this embodiment. The monitoring module 260 is configured to detect the fan enabling signal 122. When the fan enabling signal 122 is a disabling signal in the standby state of the computer device, the BMC 120 stops the running of the fan 110. However, when the fan enabling signal 122 remains being the disabling signal for an excessively long time, the BMC 120 determines that the computer device does not generate too much heat and stops the running of the fan 110, and alternatively, the BMC 120 cannot operate and thereby the fan enabling signal 122 is an enabling signal.

In the case of the second situation, the monitoring module 260 continuously detects whether the fan enabling signal 122 is a disabling signal for a predetermined period, and the predetermined period is set according to actual requirement. After reaching the predetermined period, the monitoring module 260 provides an enabling forced running signal 270 in a predetermined forced running period. When receiving the enabling forced running signal 270, the power control unit 132 of the power control module 130 provides the main power enabling signal 137 and the AUX power enabling signal 138 according to the actual power supply condition, so that the power switch 134 provides the corresponding control power CP (generally the AUX power AP in the standby state) to the fan 110.

When the rotation speed switching unit 144 of the rotation speed switching module 140 receives the enabling forced running signal 270, since the BMC 120 may not operate to provide the first fan rotation speed signal 126 for automatic adjustment, the fixed-clock-frequency PWM signal (the second fan rotation speed signal 147) generated by the CPLD 150 is used as the rotation speed control signal 148 and provided to the fan 110, so that the fan 110 is forced to run. After the predetermined forced running period, the monitoring module 260 resets and returns an internal register to zero, and continues to detect the fan enabling signal 122, so as to ensure that the fan 110 is forced to run at an interval of every two adjacent predetermined periods, thereby preventing the computer device from generating too much heat in the standby mode.

When the predetermined period is not reached and the monitoring module 260 detects that the fan enabling signal 122 is an enabling signal from a disabling state, the BMC 120 still runs normally, and the monitoring module 260 resets and returns the internal register to zero and continues to detect the fan enabling signal 122.

In this embodiment, the monitoring module 260 comprises a checking unit 262 and a timing unit 264. The checking unit 262 is coupled to the timing unit 264. In this and some other embodiments, the checking unit 262 and the timing unit 264 are implemented by the CPLD 150, but not limited to the disclosure. The checking unit 262 receives and detects the fan enabling signal 122, and when detecting that the fan enabling signal 122 is the disabling signal in the standby state of the computer device, it starts the timing unit 264 to the counting of the predetermined period. When the counting of the timing unit 264 is completed in the predetermined period and the checking unit 262 detects that the fan enabling signal 122 is still the disabling signal, the checking unit 262 provides the forced running signal 270 in the predetermined forced running period, and continues to detect the fan enabling signal 122 after the forced running period. When the checking unit 262 detects that the fan enabling signal 122 is an enabling signal from the disabling state in the predetermined period, the BMC 120 still automatically adjusts the fan 110, so that the checking unit 262 resets internal registers of the checking unit 262 and the timing unit 264, and again detects the fan enabling signal 122. The rest of the actuating process and the structure in this embodiment are illustrated in the foregoing related descriptions, and the details will not be repeated herein.

Figure 3A:
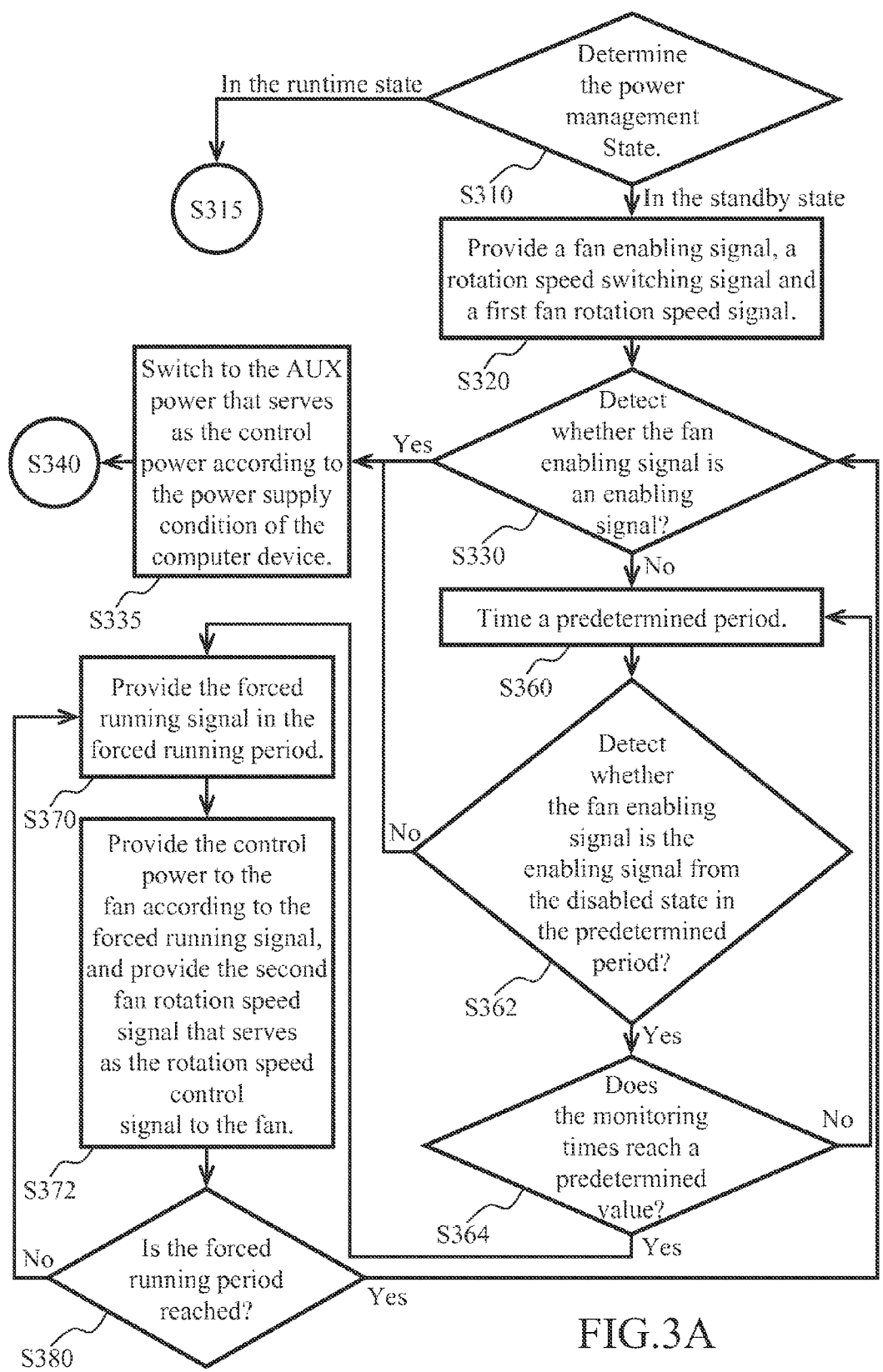
FIGS. 3A and 3B are flow charts of a fan control method according to an embodiment of the disclosure.
Figure 3B:
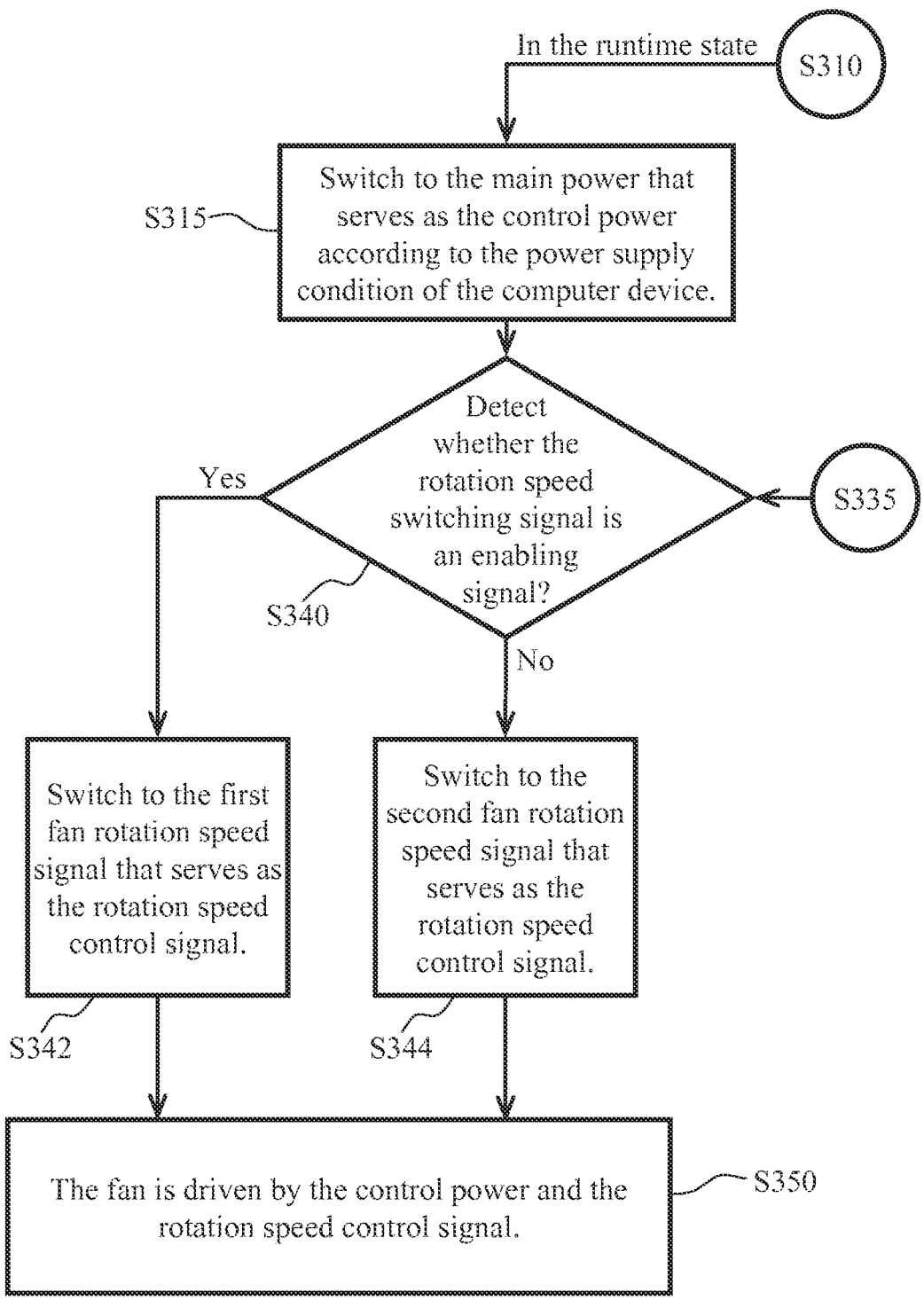

In another aspect of the embodiment, FIGS. 3A and 3B are flow charts of a fan control method adapted to a computer device according to the embodiment of the disclosure. Please refer to FIG. 3. Steps S310 to S350 in FIG. 3 are corresponding to those in the first embodiment of the disclosure in FIG. 1, and all the steps of the process in FIG. 3 are corresponding to those in the second embodiment of the disclosure in FIG. 2. Referring to FIG. 2 and FIGS. 3A and 3B, in Step S310, the BMC 120 determines the power management state of the computer device.

When the power management state of the computer device is the standby state, Step S320 is performed after Step S310, that is, the board management unit (i.e., BMC 120) provides the fan enabling signal 122, the rotation speed switching signal 124 and the first fan rotation speed signal 126. In Step S330, the power control module 130 and the monitoring module 260 both detect whether the fan enabling signal 122 is the enabling signal. The power control module 130 determines whether to provide the control power CP to the fan 110 according to the fan enabling signal 122, and the monitoring module 260 detects the fan enabling signal 122 and determines whether to perform Step S360. The steps related to the power control module 130 are described first in the following.

When the fan enabling signal 122 is the enabling signal, the board management unit determines to provide the control power CP to the fan 110. Therefore, in Step S335, the power control module 130 switches between the AUX power AP or the main power MP that serves as the control power CP according to the power supply condition of the computer device. Since the computer device is in the standby state, the power control module 130 switches to the AUX power AP that serves as the control power CP.

In Step S310, when the power management state of the computer device is the runtime state, Step S315 is performed, that is, the power control module 130 switches to the main power MP that serves as the control power CP according to the power supply condition (normal power supply) of the computer device.

In Step S340, the rotation speed switching module 140 detects whether the rotation speed switching signal 124 is an enabling signal. When the rotation speed switching signal 124 is the enabling signal, Step S342 is performed, that is, the rotation speed switching module 140 accordingly switches to the first fan rotation speed signal 126 that serves as the rotation speed control signal 148, so that the board management unit automatically controls the fan 110. When the rotation speed switching signal 124 is the disabling signal, Step S344 is performed, that is, the rotation speed switching module 140 accordingly switches to the second fan rotation speed signal 147 that serves as the rotation speed control signal 148, so that the fan 110 runs at a fixed rotation speed. Therefore, in Step S350, the fan 110 is driven to run by the control power CP and the rotation speed control signal 148.

Return to the implementation of the monitoring module 260 in Step S330. When the monitoring module 260 detects that the fan enabling signal 122 is the disabling signal, Step S360 is performed after Step S330, that is, the monitoring module 260 counts a predetermined period by using the timing unit 264, and the checking unit 262 continues to detect the fan enabling signal 122. In Step S362, the checking unit 262 detects whether the fan enabling signal 122 is the enabling signal from the disabling state in the predetermined period. When the checking unit 262 detects that the fan enabling signal 122 is the enabling signal from the disabling state in the predetermined period, Step S335 is performed after Step S362 (that is, Step S362 is negative), and the register in the monitoring module 260 is reset and returned to zero, so as to continue to detect the fan enabling signal 122.

Return to Step S362. When the counting of the timing unit 264 is completed in the predetermined period and the checking unit 262 detects that the fan enabling signal 122 is still the disabling signal (that is, Step S362 is positive), Step S364 is performed, that is, the checking unit 262 checks whether the monitoring times reaches a predetermined value. If the monitoring times do not reach the predetermined value, it is possible that the BMC 120 is still running, and the checking unit 262 returns from Step S364 to Step S360 to accumulate the monitoring times.

When the monitoring times do not reach the predetermined value, Step S370 is performed after Step S364, that is, the checking unit 262 provides the forced running signal 270 to the power control module 130 and the rotation speed switching module 140 in the predetermined forced running period. In Step S372, the power control module 130 provides the control power CP to the fan 110 according to the forced running signal 270. The rotation speed switching module 140 provides the second fan rotation speed signal 147 that serves as the rotation speed control signal 148 to the fan 110 at the same time of the actuation of the power control module 130 or in a set precedence order.

In Step S380, the checking unit 262 determines whether the predetermined forced running period is reached (namely, come). When the forced running period is not reached (that is, Step S380 is negative), the checking unit 262 still continues to perform Steps S370 to S372. When the forced running period is reached (that is, Step S380 is positive), the checking unit 262 returns to Step S330 to continue to detect the fan enabling signal 122.

In view of the above, the fan control system and the method thereof in the embodiments of the disclosure are capable of automatically adjusting the power supply of a fan and controlling a rotation speed thereof according to a power management state (for example, a runtime state or a standby state) and a power supply condition of a computer device, so that the heat dissipation effect of a part of the apparatuses in the standby state is maintained at a certain level, and the heat generated by these apparatuses is dissipated sufficiently by using the same fan in the runtime state. In addition to automatically adjusting the fan rotation speed through a board management unit (i.e., BMC), a built-in fixed rotation speed signal is used for adjusting the fan rotation speed. Moreover, in the embodiments of the disclosure, in order to avoid failures of the board management unit, a monitoring device is additionally provided to forcedly start the fan and enable the fan to run when the fan is not started for a long time in the standby state, so as to maintain the heat dissipation efficiency of the computer device.

What is claimed is:

1. A fan control system, applicable to a computer device, the fan control system comprising:
    a fan driven by a control power and a rotation speed control signal;
    a board management unit configured to provide a fan enabling signal, a rotation speed switching signal and a first fan rotation speed signal in a standby state of the computer device;
    a power control module coupled to the board management unit and the fan, and wherein the power control module is configured to receive the fan enabling signal so as to determine whether to provide the control power to the fan, and is configured to switch between an AUX power or a main power that serves as the control power according to a power supply condition of the computer device, so as to provide the control power to the fan;
    a rotation speed switching module coupled to the board management unit and the fan, and wherein the rotation speed switching module is configured to receive the rotation speed switching signal so as to accordingly switch between the first fan rotation speed signal or a second fan rotation speed signal that serves as the rotation speed control signal, and is configured to provide the rotation speed control signal to the fan; and
    a monitoring module coupled to the board management unit, the power control module and the rotation speed switching module, and wherein the monitor module is configured to detect the fan enabling signal, and after the fan enabling signal is a disabling signal for a predetermined period in the standby state of the computer device, the monitor module provides a forced running signal in a forced running period;
    wherein, the power control module receives the forced running signal for providing the control power to the fan, and the rotation speed switching module receives the forced running signal for providing the second fan rotation speed signal that serves as the rotation speed control signal to the fan;
    wherein, the monitoring module comprises a checking unit and a timing unit coupled to the checking unit;
    wherein, the checking unit receives and detects the fan enabling signal, when detecting that the fan enabling signal is the disabling signal in the standby state of the computer device, the timing unit is operated to count the predetermined period, and after the counting of the predetermined period is completed and the fan enabling signal is still not the enabling signal, the checking unit provides the forced running signal in the forced running period and continues to detect the fan enabling signal after the forced running period.

2. The fan control system according to claim 1, wherein the power control module comprises:
    a power control unit configured to receive the fan enabling signal and to determine whether the fan enabling signal is an enabling signal, and when the fan enabling signal is the enabling signal, the power control unit receives a power supply enabling signal to provide a main power enabling signal and an AUX power enabling signal according to the power supply condition of the computer device; and
    a power switch coupled to the power control unit for receiving a main power and an AUX power and providing the control power, when the main power enabling signal is the enabling signal, the power switch uses the main power as the control power, and when the main power enabling signal is a disabling signal and the AUX power enabling signal is the enabling signal, the power switch uses the AUX power as the control power.

3. The fan control system according to claim 1, wherein the rotation speed switching module comprises:
- a state switching unit configured to receive the rotation speed switching signal and a runtime-to-standby signal, and when the runtime-to-standby signal is the enabling signal, the state switching unit provides a rotation speed adjusting signal according to the rotation speed switching signal;
- a fixed rotation speed signal generating unit configured to generate a pulse width modulation (PWM) signal whose clock frequency is fixed so as to serve as the second fan rotation speed signal; and
- a rotation speed switching unit coupled to the state switching unit and the fixed rotation speed signal generating unit, and configured to receive the rotation speed adjusting signal and to accordingly switch between the first fan rotation speed signal or the second fan rotation speed signal that serves as the rotation speed control signal.

4. The fan control system according to claim 1, wherein when the checking unit detects that the fan enabling signal is the enabling signal in the predetermined period, the checking unit and the timing unit are reset.

* * * * *